United States Patent [19]

Perks et al.

[11] 4,328,399
[45] May 4, 1982

[54] PUSHBUTTON SWITCH ASSEMBLY FOR TELECOMMUNICATIONS AND OTHER INPUT

[75] Inventors: Roger Perks, Kanata; Phillip J. Dudley, Nepean, both of Canada

[73] Assignee: Northern Telecom Limited, Montreal, Canada

[21] Appl. No.: 131,877

[22] Filed: Mar. 20, 1980

Related U.S. Application Data

[63] Continuation-in-part of Ser. No. 9,656, Feb. 5, 1979, Pat. No. 4,243,846.

[51] Int. Cl.³ .............................................. H04M 1/50
[52] U.S. Cl. .............................. 179/90 K; 340/365 S; 361/397; 174/68.5
[58] Field of Search ............. 204/38 C, 15; 179/90 K; 340/365 R; 361/397, 402, 411; 339/17 A; 174/120 C, 50.61, 122 G, 122 C, 117 PC, 68.5; 29/855, 856; 200/5 R, 5 A

[56] References Cited

U.S. PATENT DOCUMENTS

| | | | |
|---|---|---|---|
| 2,412,624 | 12/1946 | Mallina | 179/90 K |
| 3,290,439 | 12/1966 | Willcox et al. | 179/90 K |
| 3,296,099 | 1/1967 | Dinella | 29/604 |
| 3,439,255 | 4/1969 | Carnes et al. | 174/68.5 |
| 3,469,729 | 9/1969 | Grekila et al. | 174/50.61 |
| 3,641,254 | 2/1972 | Bunting et al. | 174/68.5 |
| 3,745,095 | 7/1973 | Chadwick et al. | 174/68.5 |
| 3,934,335 | 1/1976 | Nelson | 174/68.5 |
| 4,033,030 | 7/1977 | Robinson et al. | 179/90 K |

*Primary Examiner*—Gerald L. Brigance
*Attorney, Agent, or Firm*—Sidney T. Jelly

[57] ABSTRACT

A pushbutton switch assembly has at least one of the conventional PCB's replaced by a porcelain coated steel plate. The contact circuit for the pushbutton switches is formed on the top surface of the steel plate. It is also possible to replace both PCB's of a conventional switch by forming a second circuit on the under surface of the steel plate, with the electrical devices mounted thereon. Use of the steel plate enables the normal metal mounting plate to be omitted.

16 Claims, 9 Drawing Figures

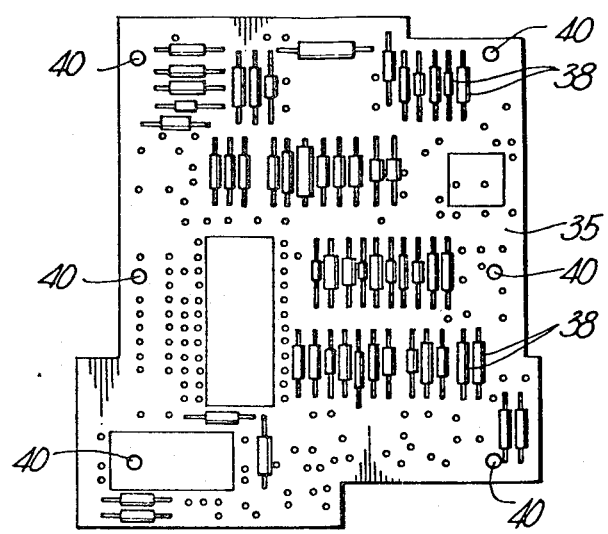
Fig-2-
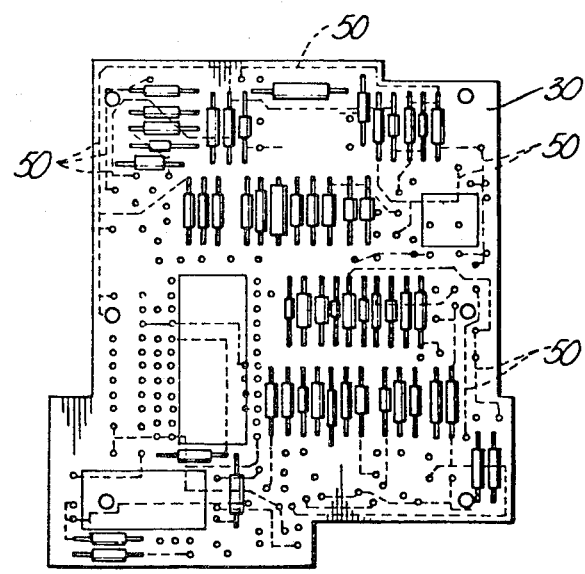
Fig-4-

PUSHBUTTON SWITCH ASSEMBLY FOR TELECOMMUNICATIONS AND OTHER INPUT

This application is a continuation-in-part of application Ser. No. 009,656, filed Feb. 5, 1979 now U.S. Pat. No. 4,243,846.

This invention relates to a pushbutton switch assembly for telecommunications and other input apparatus, and particularly though not exclusively to a pushbutton dial for a telephone.

A particular form of pushbutton assembly comprises a sandwich structure having, starting from the top or outer face, a plurality of pushbuttons, a contact member actuated by the pushbuttons, a first printed circuit board (PCB) on the top surface of which is the contact circuit with contact positions contacted by contacts on the contact member, a further PCB spaced from the first PCB, the further PCB having on its read surface a printed circuit and also carrying the various electrical devices of the electrical circuit for the assembly; and a metal plate or bracket by which the assembly is mounted.

PCB's are quite expensive items but have become standard items for carrying circuits and for mounting of devices. A PCB is usually formed of glass fibre reinforced resin. Sheets of the basic material are manufactured, and then the surface treated to accept and retain a layer of copper. This layer is then usually photolithographically etched to produce the desired circuit pattern. A number of PCB's may be formed from a sheet, by shearing from the sheet.

The present invention provides for replacing of at least the first PCB, carrying the contact circuit, by a porcelain coated steel plate carrying the contact circuit. A further feature of the present invention is to use the procelain coated steel plate to also replace the further PCB by forming the circuit normally on the further PCB on the rear surface of the porcelain/steel plate and mounting the electrical devices on the porcelain/steel cheaper to produce than a glass fibre reinforced resin PCB, the circuits being applied by thick film printing techniques followed by firing.

As an additional feature, the use of a porcelain coated steel plate to replace at least one of the PCB's enables the metal plate or bracket to be dispensed with. The porcelain/steel plate is rigid and self-supporting, whereas the PCB's are flexible and are not strong enough to use without the metal plate or bracket.

The invention will be readily understood by the following description of certain embodiments, by way of example, in conjunction with the accompanying drawings, in which:

FIG. 2 is a view on the rear face of the remaining PCB with devices mounted;

FIG. 4 is an illustrative view on the rear face of the porcelain coated steel member of the assembly in FIG. 3, with devices mounted;

Figure 1:
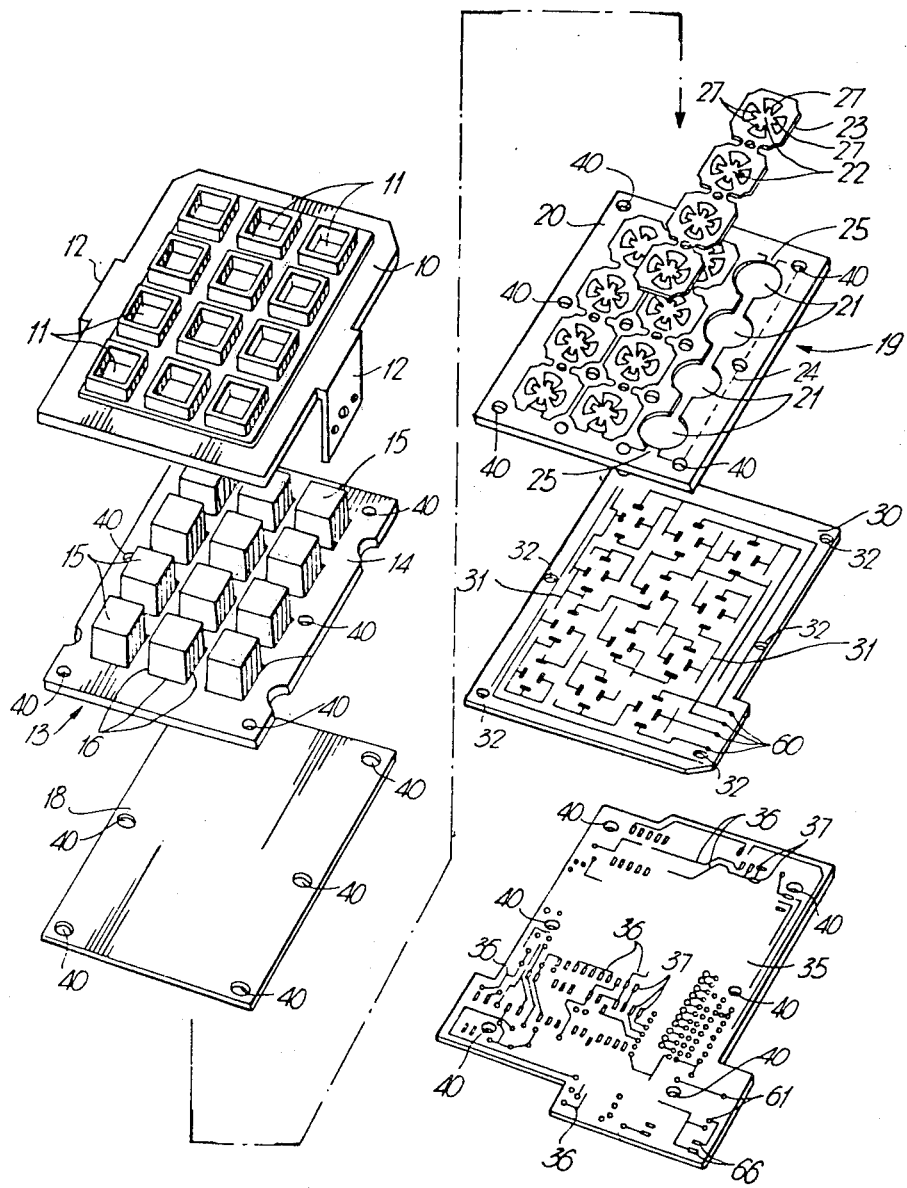
FIG. 1 is an exploded perspective view of one form of a pushbutton assembly for a telephone dial, with one PCB replaced.

The form of pushbutton assembly illustrated in FIG. 1 comprises a molded plastic bezel 10 having a plurality of apertures 11 arranged in columns and rows. At each side of the bezel 10 is a bracket 12, molded integrally with the bezel in the particular example, but can be separate members attached to the bezel. Brackets 12 provide the attachment, or mounting means for the pushbutton assembly.

Extending next to the bezel 10 and in contact with its underside is a molded button or key assembly 13. The key assembly 13 comprises a flat sheet 14 with a plurality of keys or buttons 15 molded therewith. The keys are separated from the sheet on three sides, indicated at 16 but hingedly attached at the fourth side—indicated at 17. The keys or buttons 15 extend up through the bezel, a key or button in each aperture 11.

Beneath the button or key assembly 13 is a thin flexible membrane 18 followed by a spring contact assembly 19. In the particular arrangement illustrated in FIG. 1, the spring contact assembly 19 comprises a support and spacer member 20 having a plurality of apertures 21 therein, arranged in columns and rows corresponding to the apertures 11 in the bezel 10. Supported on the support and spacer member 20 are a number of spring contact members 22. In the particular example the spring contact members 22 are in strips 23 and three such strips 23 are provided, corresponding to the three columns of buttons or keys 15. A spring contact member 22 is positioned over each aperture 21 and beneath each button or key 15. To retain the strips in position they sit in slight recesses 24 in the member 20 and the ends of the strips fit in slits cut in a key member 25 at each end.

The spring contact members are conveniently of the form described in U.S. Pat. No. 4,029,916, having a snap action when the center portion of a contact member is depressed by pressure on a button or key 15. When a contact member snaps down, contacts 27 move into contact with contact areas of a circuit.

Positioned beneath the support and spacer member 19 is a steel sheet circuit member which is coated with porcelain, at least on its upper surface, and indicated at 30. On the porcelain surface is formed the switch contact circuit 31, as by thick film techniques, to form a circuit board, the circuit having a plurality of switch positions, each position having a plurality of contact areas. In one such technique, a silver-containing frit is thick film printed or deposited on the porcelain/steel sheet which is then fired to form the conducting pattern. A particular way of forming the porcelain coated sheet is by electrodeposition of a frit on the steel sheet, followed by firing. The conductor pattern is then formed and again fired.

Prior to depositing or forming the porcelain coating, the steel sheet is perforated at various positions, as desired, for example as indicated, at 32. These perforations may be provided for alignment of the various members, and/or passage of studs, screws or rivets, or similar devices for fastening members together. To prevent a meniscus building up around these perforations during application of the porcelain to the steel sheet, the peripheral edges of the perforations are coined to give a slightly chamfered edge.

Beneath the porcelain/steel circuit board 30 is a conventional PCB 35. This is of a normal form, that is being a sheet of resin impregnated glass fibre with a circuit pattern 36 on the top surface. Only small sections of the circuit pattern are illustrated for clarity. Contact pads 37 are formed as part of the circuit pattern and circuit devices are inserted, from the undersurface in FIG. 1, and wave soldered to the contact pads. FIG. 2, which is a view on the undersurface of the PCB 35, illustrates some of the devices 38 inserted.

Conveniently, in the example illustrated in FIGS. 1 and 2, small cylindrical protrusions or studs are molded on the undersurface of the bezel 10, and which pass through holes 40 in the key assembly 13, the membrane 18, the spring contact assembly support plate 20, perforations 32 in the porcelain/steel circuit board 30 and holes 40 in the PCB 35. An insulating layer is formed on the rear or undersurface of the porcelain/steel circuit board 30. This is usually of porcelain as on the front or upper surface but can be of other material. Another alternative is to provide an intermediate member such as a flexible membrane similar to membrane 18. This prevents electrical contact between the PCB 35 and the rear surface of the board 30.

After assembly the protrusions or studs can be rivetted over, as by heating or sonic fusion, to provide a complete, unitary assembly for easy handling and assembly into a telephone set or other apparatus. The whole unit is normally mounted by means of the brackets 12.

FIGS. 1 and 2 illustrate what can be considered as a first stage, eliminating the metal support member normally provided, the porcelain/steel circuit board 30 providing a rigid member in its place. Also one conventional form of resin impregnated glass fibre PCB has been replaced by the porcelain/steel board. This provides two cost reductions; elimination of the metal support member and a cheaper form of circuit board.

Figure 3:
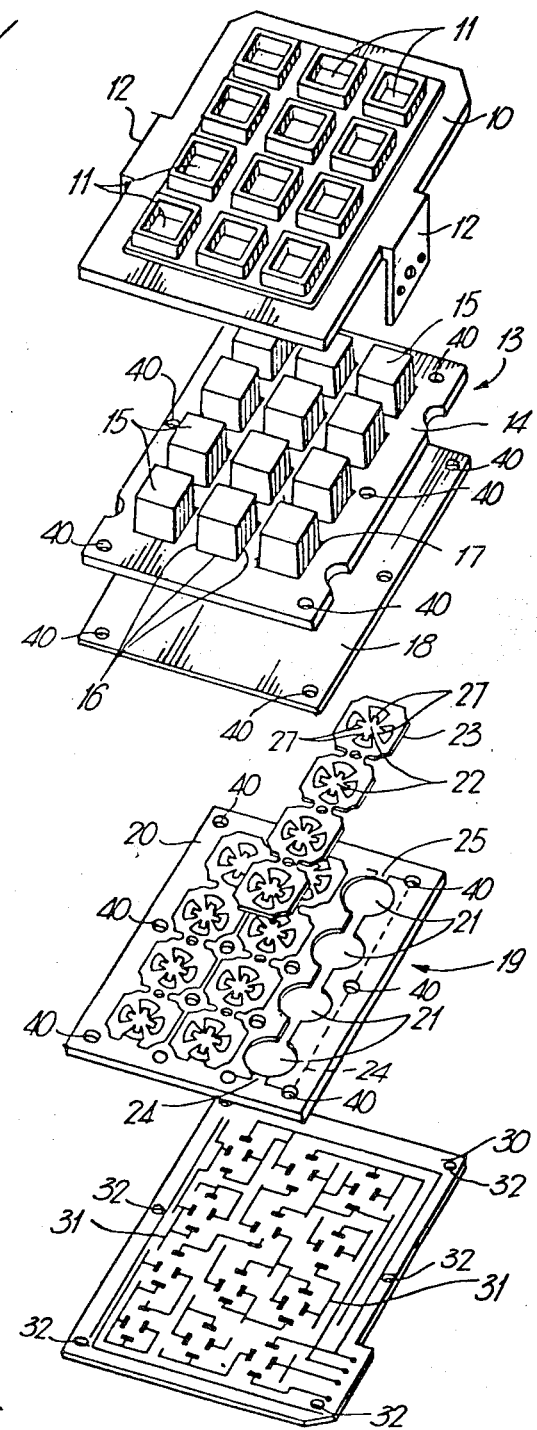
FIG. 3 is an exploded perspective view of one form of a pushbutton assembly for a telephone dial with both PCB's replaced.

FIGS. 3 and 4 illustrate a further stage in which the second PCB, board 35 in FIGS. 1 and 2, is eliminated. FIG. 3 is similar to FIG. 1 insofar as the bezel 10, key assembly 13, membrane 18 and spring contact assembly 19 are concerned.

Thus, in FIG. 2 there is the bezel 10 with apertures 11 and brackets 12. Below the bezel is the button assembly 13, comprising flat sheet 14, and buttons or keys 15. Next to the button or key assembly 13 is the membrane 18 and then the spring contact assembly 19 comprising support and spacer member 20 and spring contact members 22. Then follows the porcelain coated steel plate 30.

In this embodiment, as seen in FIG. 4, the porcelain coated steel plate 30 has a circuit pattern 50 on the undersurface, the plate having porcelain on both surfaces and the circuit pattern 50 again being formed, for example, by thick film techniques, using a silver frit which is then fired. For clarity, the circuit pattern 50 is shown dotted but is in fact composed of continuous conductors. The various electrical and electronic components, indicated generally at 51, are attached to the circuit pattern, for example by heat bonding or soldering.

Figure 5:
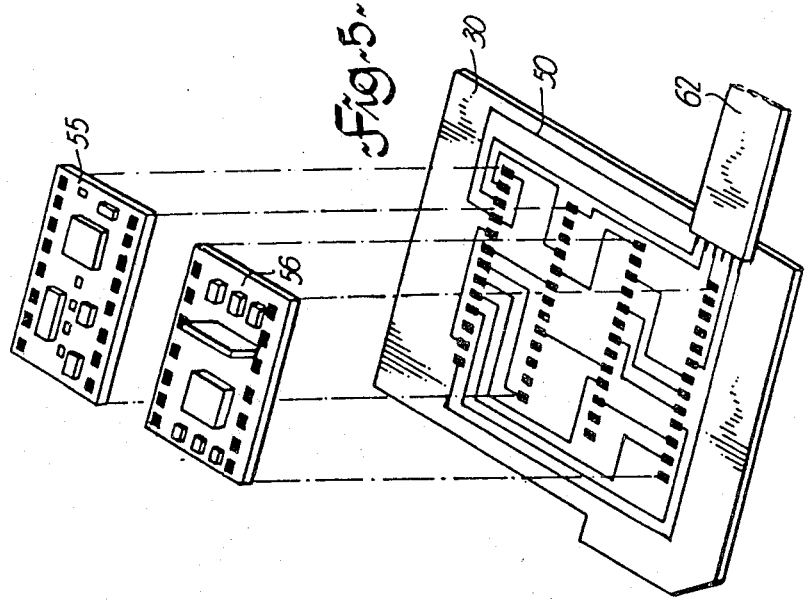
FIG. 5 is an exploded perspective view of the rear surface of the porcelain coated steel plate, for an alternative embodiment and illustrating circuit members for mounting on the plate.

FIG. 5 illustrates a modification of the assembly of FIGS. 3 and 4 in which the conventional electrical and electronic components are replaced by hybrid circuit devices 55 and 56 which are connected to the circuit pattern 50, as by heat bonding or soldering. Such an assembly provides a very compact and economic package which can be used in various telephone sets and similar devices. The forming of the circuit 50 pattern is conveniently by the same method as is used for forming the circuit 31, that is thick film deposition of a silver containing frit followed by firing. However other methods of forming the circuits 31 and 50 can be used, for example photolithographic etching.

Interconnection will, of course, be required between the two circuit boards 30 and 35 in the embodiment of FIGS. 1 and 2, and between the two sides of the circuit board 30 in the embodiments of FIGS. 3 and 4 and FIG. 5.

In the embodiment of FIGS. 1 and 2, a flexible tape or strip conductor member can extend between the board 30 and board 35 for example being connected at one end to contact areas 60 on circuit board 30 at the other end to contact areas 61 on circuit board 35.

In the embodiment of FIGS. 3 and 4, and FIG. 5, cross-connection or interconnection can be provided by conductor paths through the porcelain/steel circuit board. This can be obtained by making holes through the steel plate prior to coating, coating with porcelain and then forming the circuit patterns. The porcelain will also coat the interior surfaces of the holes and the circuit pattern can be caused to extend through the holes by applying suction to the board when the circuit is applied. Thus, for example, if a silver-containing frit is applied on one surface by thick film deposition, a suction is applied at the other surface to draw the frit through the hole. The same can be done when the circuit material is applied to the other side, to ensure good interconnections. The holes are coined prior to coating the steel plate with porcelain.

The circuit board 30, both in FIGS. 1 and 2, and in FIGS. 3 and 4 and FIG. 5, can be connected to any further components in the apparatus by a further flexible conductor member, as illustrated at 62 in FIG. 5.

Figure 6:
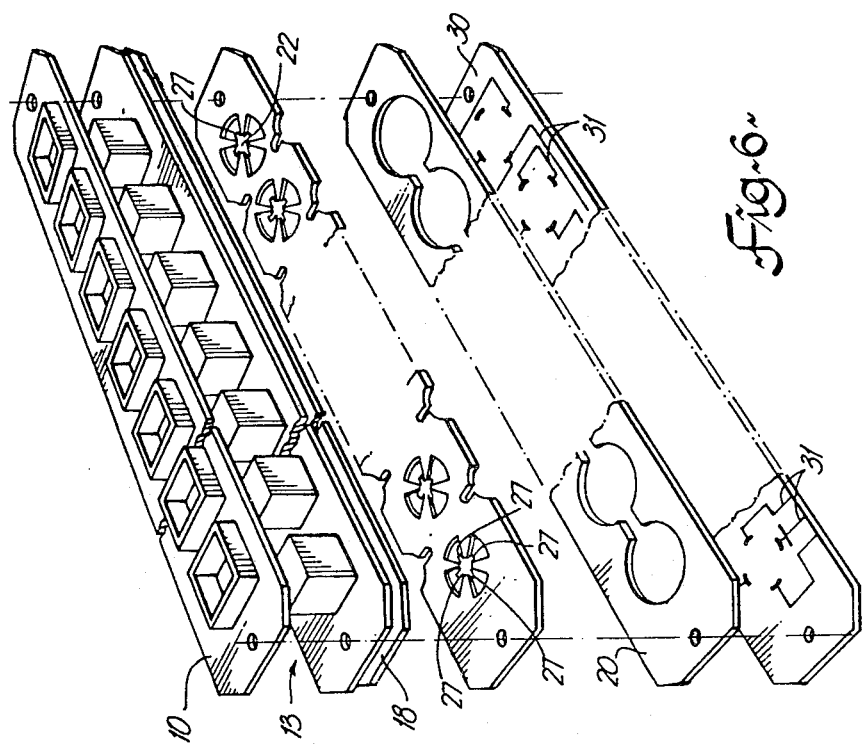
FIG. 6 is an exploded perspective view of a further form of pushbutton assembly for a key strip, as for a telephone set or other apparatus.

In addition to the conventional form of pushbutton switch assembly as illustrated in FIGS. 1 to 5, the invention is applicable to other forms of pushbutton assembly and one example of such alternative forms is illustrated in FIG. 6.

In FIG. 6 similar members or items are provided as in the embodiments of FIGS. 1 and 2, or 3 and 4, or FIG. 5 but the shapes are different. There is an elongate bezel 10 with apertures 11. Beneath the bezel is an elongate molded button assembly 13 with buttons or keys 15, one for each aperture 11. The basic form of the button assembly is as in FIGS. 1 or 3. Beneath the button assembly 13 is thin flexible membrane 18 and then spring assembly 19 comprising a strip of contact members 22 on a support and spacer member 20. Then there is an elongate circuit board 30.

In the embodiment of FIG. 6, it is assumed that the circuit board 30 is as in FIGS. 3 and 5, that is porcelain coated steel with one circuit—31—on the top surface and the other circuit—circuit pattern 50 of FIG. 4—on the undersurface and the electronic components connected to the circuit on the undersurface. Hybrid devices, as in FIG. 6, can be used. Alternatively, the embodiment of FIG. 6 can be modified to be generally as that of FIGS. 1 and 2, that is with the circuit board 30 of porcelain/steel and carrying the circuit 31, but with a separate circuit board carrying the second circuit and the associated electronic components.

The pushbutton, or key, assembly of FIG. 6 is, for example, assembled in a sandwich structure and screws passed through the holes 65 in the various members. These can also serve as mounting and/or attachment screws for the complete assembly. Alternatively other mounting means can be provided, or protrusions molded on the undersurface of the bezel 10 passing through suitable holes in the various members, used to assemble the members, as in FIGS. 1 and 2, or 3 and 4.

Figure 9:
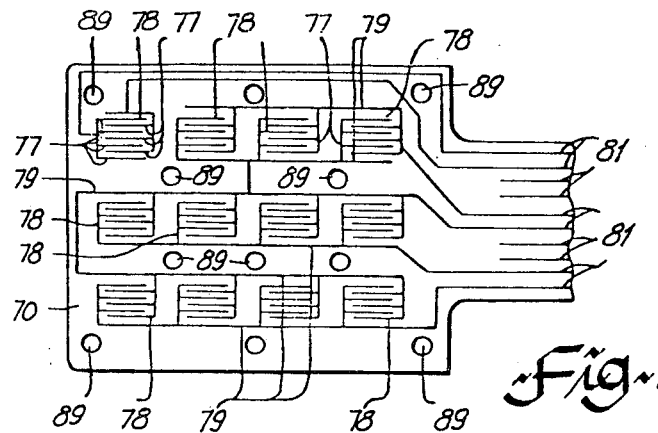
FIG. 9 is a plan view of one face of a porcelain or steel circuit member, illustrating the circuit associated with the contact member of FIG. 8.
Figure 8:
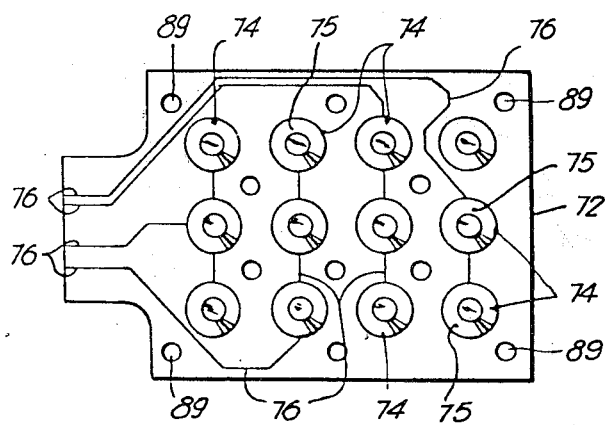
FIG. 8 is a plan view of a contact member as used in the pushbutton dial of FIG. 7.
Figure 7:
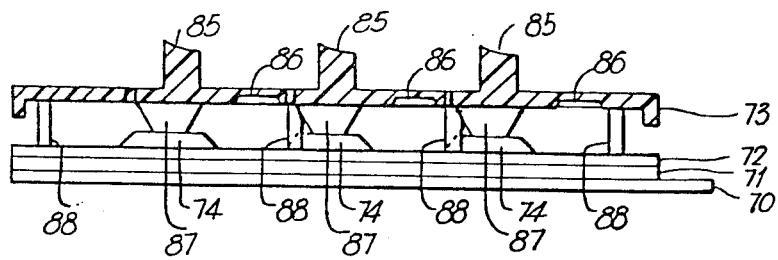
FIG. 7 is a cross-section through another form of pushbutton dial.

The form of pushbutton assembly, or dial, illustrated in FIGS. 7, 8 and 9 has the spring contact assembly 19 of FIGS. 1 to 6 replaced by a flexible electrically insulating contact member having a plurality of domed areas formed therein. A suitable material is mylar. The assembly comprises a circuit member 70, which is of porcelain coated steel similar to the circuit member 30 of FIGS. 1 and 2—in FIGS. 3, 4, and 5, and also in FIG. 6, an electrically insulating sheet 71, the flexible contact member 72 and a molded button or key member 73. The flexible contact member has the domed areas 74 arranged in columns and rows and the concave surfaces of the domed areas are metallized, at 75, the metallized areas connected to circuit conductors 76.

The concave surfaces of the domed areas face towards the circuit member. On the surface of the circuit member is a conductor pattern 77. The conductor pattern defines a plurality of contact areas, indicated at 78, a contact area aligned with each domed area 74. The contact areas are interconnected by conductors 79 which extend to an edge of the circuit member, at 80. The conductors 80 provide for connection to other electrical and electronic components. Conductors 81 are also provided to connect to the conductors 76 of the contact member. Electrical connection between conductors 76 and conductors 81 can be made by stapling the assembly together, metal staples passing through conductors 76 and 81. Conductors 81 can also connect to electrical and electronic components, for example mounted on the back surface of the circuit member 72.

The pushbutton or key member 73 has a plurality of cantilevered pushbuttons 85 arranged in columns and rows, the buttons extending from the front or top side of the member 73. The buttons 85 are molded integrally as parts of the member 73 but are separated on three sides and connected by a thin portion 86 which acts as a hinge. Projections 87 extend from the back of each button 85 and are in contact with the domed areas 74. Pressure on a button 85 pushes down a domed area, which moves into contact with a contact area on the circuit member, with a snap action. Pins 88 extending from the back of the member 73 pass through alignment holes 89 in the contact member and circuit member.

The pushbutton, or key assembly need not be restricted to a telephone set style as in FIGS. 1 to 4, or in a strip form as in FIG. 6, but can be much larger with many rows and columns, or other configurations. A very simple, economic and strong assembly is provided. Assemblies in accordance with the present invention can be used for telephones, and other telecommunications apparatus, keyboard terminals, calculators and other input apparatus.

What is claimed is:

1. A pushbutton switch assembly comprising:
   a steel sheet circuit member having upper and lower surfaces;
   a porcelain layer on at least said upper surface;
   a contact circuit on the porcelain layer, the circuit including a plurality of switch positions, each position including at least one contact area;
   a contact member extending over said contact circuit, the contact member including a plurality of deformable contact portions, each contact portion aligned with a switch position;
   a pushbutton assembly mounted on said contact member and including a plurality of pushbuttons, a pushbutton for each said deformable contact portion;
   said contact member being of flexible electrically insulating material, each of said deformable contact portions comprising a domed area extending towards a pushbutton, a domed area aligned with each pushbutton and a related switch position on said contact circuit, an electrically conductive surface layer on a concave surface of each domed area and electrical conductors on said flexible contact member connecting to said electrically conductive surface layers;
   each said deformable contact portion having a snap action for rapid making and breaking of contact between the conductive surface layer and the related contact area, depression of a pushbutton pressing on a deformable contact portion to move said conductive surface layer into contact with the related contact area.

2. An assembly as claimed in claim 1, including a porcelain layer on the lower surface and an electrical circuit on the porcelain layer on the lower surface.

3. An assembly as claimed in claim 1, the contact circuit comprising a thick film pattern of electrically conductive material in the form of a fused frit containing an electrically conductive metal.

4. An assembly as claimed in claim 2, the electrical circuit on the lower surface comprising a thick film pattern of electrically conductive material in the form of a fused frit containing an electrically conductive metal.

5. An assembly as claimed in claim 1, including circuit means associated with the lower surface of the steel sheet circuit member, the circuit means comprising an electrical circuit pattern and electrical devices connected to the circuit pattern.

6. An assembly as claimed in claim 1, including a bezel mounted on the pushbutton assembly and including a plurality of apertures therethrough, a pushbutton positioned in each aperture and extending through the bezel.

7. An assembly as claimed in claim 6, including means on the bezel for mounting the pushbutton switch assembly.

8. An assembly as claimed in claim 1, each of the switch positions including a plurality of contact areas; the contact member comprising a spring contact assembly including the plurality of contact portions, each contact portion including a plurality of contacts, a contact for each contact area at the related switch position.

9. An assembly as claimed in claim 1, the pushbuttons molded integrally in the pushbutton assembly, each pushbutton separated on three sides and cantilevered at a fourth side.

10. An assembly as claimed in claim 5, the circuit means comprising: a printed circuit board mounted on the lower surface of the steel sheet circuit member and having upper and lower surfaces, the circuit pattern on one of the surfaces.

11. An assembly as claimed in claim 10, the circuit pattern on the upper surface of the printed circuit board and the electrical devices mounted on the lower surface of the printed circuit board and connected to the circuit pattern through the printed circuit board.

12. An assembly as claimed in claim 11, the electrical devices comprising hybrid circuit devices.

13. An assembly as claimed in claim 5, the steel sheet circuit member having a porcelain layer on the lower surface, the circuit means comprising an electrical circuit pattern on the porcelain layer on the lower surface and electrical devices mounted on and connected to the circuit pattern.

14. An assembly as claimed in claim 13, the electrical devices comprising hybrid circuit devices.

15. An assembly as claimed in claim 1, said pushbuttons arranged in columns and rows.

16. An assembly as claimed in claim 1, the pushbuttons arranged in a single column or row.

* * * * *

UNITED STATES PATENT AND TRADEMARK OFFICE
CERTIFICATE OF CORRECTION

PATENT NO. : 4,328,399
DATED : May 4, 1982
INVENTOR(S) : George V. Lenaerts et al.

It is certified that error appears in the above-identified patent and that said Letters Patent is hereby corrected as shown below:

On the title page, Item (75) inventors should read

-- George V. Lenaerts, Roger Perks and Phillip J. Dudley --.

Signed and Sealed this

Third Day of August 1982

[SEAL]

Attest:

Attesting Officer

GERALD J. MOSSINGHOFF

Commissioner of Patents and Trademarks